United States Patent
Nakazono

(10) Patent No.: US 7,791,371 B2
(45) Date of Patent: Sep. 7, 2010

(54) LEVEL SHIFT CIRCUIT AND POWER SEMICONDUCTOR DEVICE

(75) Inventor: Koichi Nakazono, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/457,283

(22) Filed: Jun. 5, 2009

(65) Prior Publication Data

US 2009/0315609 A1    Dec. 24, 2009

(30) Foreign Application Priority Data

Jun. 19, 2008   (JP)   ............................. 2008-159932

(51) Int. Cl.
*H03K 19/0175*   (2006.01)
*H03L 5/00*   (2006.01)

(52) U.S. Cl. ............................. 326/68; 326/63; 327/333

(58) Field of Classification Search .................. 326/62, 326/63, 68, 80, 81; 327/333
See application file for complete search history.

(56) References Cited

U.S. PATENT DOCUMENTS 6,201,429 B1 * 3/2001 Rosenthal ................... 327/333
7,019,560 B2 * 3/2006 Wimmer et al. ............... 326/96
7,429,873 B2 * 9/2008 Peschke ......................... 326/81
7,688,049 B2 * 3/2010 Iwabuchi et al. ............. 323/271
2006/0186922 A1 * 8/2006 Rozsypal ....................... 326/63
2007/0170897 A1 * 7/2007 Williams ...................... 323/222

FOREIGN PATENT DOCUMENTS

JP   11-205123   7/1999

* cited by examiner

*Primary Examiner*—Rexford N Barnie
*Assistant Examiner*—Thienvu V Tran
(74) *Attorney, Agent, or Firm*—Foley & Lardner LLP

(57) ABSTRACT

A level shift circuit includes a drive transistor, a first PMOS transistor, and first and second clamp transistors of PMOS type. The drive transistor, which drives the gate of the high-side NMOS transistor in a power semiconductor device, has a source-drain path coupled between a boot potential generated by a bootstrap circuit provided in the semiconductor device and a source potential of the high-side NMOS transistor. The first PMOS transistor has a source coupled to the boot potential, and a drain coupled to the gate of the drive transistor. The first clamp transistor has a gate coupled to the source potential of the high-side NMOS transistor, and a source coupled to the drain of the first PMOS transistor. The second clamp transistor has a gate coupled to the source potential of the high-side NMOS transistor, and a source coupled to the gate of the first PMOS transistor.

12 Claims, 4 Drawing Sheets

LEVEL SHIFT CIRCUIT AND POWER SEMICONDUCTOR DEVICE

BACKGROUND

1. Field of the Invention

The present invention relates to a level shift circuit that generates an output signal for driving a high-side NMOS transistor included in a power semiconductor device.

2. Description of Related Art

A power semiconductor device such as a step-down DC-DC converter includes two switching elements connected in series between a power supply potential and a ground potential, and causes the two switching elements to complementarily turn on and off. To satisfy the need of miniaturization and long-term driving of an electronic device, an N-channel metal-oxide semiconductor (NMOS) transistor is used as a high-side (high-potential-side) switching element of the two switching elements. The NMOS transistor has a smaller mounting area than that of a P-channel metal-oxide semiconductor (PMOS) transistor, and has satisfactory characteristics such as an on-resistance characteristic. Therefore, the use of the NMOS transistor as the high-side switching element results in a reduction in mounting area of the switching element and an increase in efficiency.

The source potential of the high-side NMOS transistor changes from the ground potential (0 V) to about a power supply potential VCC (for example, 5 V). Accordingly, in order to drive the high-side NMOS transistor, a bootstrap circuit and a level shift circuit are required. The bootstrap circuit generates a high potential V_BOOT (for example, 2VCC=10 V) based on the power supply voltage, and supplies the high potential to drive buffers for directly driving each of the level shift circuit and the high-side NMOS transistor, and the like. Further, the level shift circuit converts the voltage amplitude of a pulse width modulation (PWM) control signal for on/off control of the high-side NMOS transistor. Specifically, the level shift circuit converts the PWM control signal whose level changes between the ground potential (0 V) and the power supply potential VCC (for example, 5 V), into an output signal whose level changes between the ground potential (0 V) and a maximum value of the high potential V_BOOT (for example, 10 V).

The level shift circuit includes a plurality of switching transistors. For this reason, attention should be paid to prevent a gate-source voltage and a drain-source voltage of the transistors provided in the level shift circuit from exceeding a predetermined breakdown voltage level. It is necessary for a level shift circuit in the prior art shown in FIG. 4 to use a high breakdown voltage transistor. On the other hand, a level shift circuit in the prior art shown in FIG. 5 can be formed using a transistor having a low breakdown voltage relative to a maximum potential difference between the high potential V_BOOT and the ground potential. The level shift circuits shown in FIGS. 4 and 5 are briefly described below.

A level shift circuit 50A shown in FIG. 4 is disclosed in Japanese Unexamined Patent Application Publication No. 11-205123. The level shift circuit 50A increases the voltage amplitude of the PWM control signal input to an input terminal 501 to thereby generate an output signal to be supplied to an output terminal 502. The source and back gate of each of NMOS transistors M1 and M2 are connected to the ground potential. The gate of the NMOS transistor M1 is supplied with the PWM control signal input to the input terminal 501. Meanwhile, the gate of the NMOS transistor M2 is supplied with an inverted signal of the PWM control signal, which is inverted by an inverter 503. Thus, when one of the transistors M1 and M2 turns on, the other of the transistors M1 and M2 turns off. In other words, the transistors M1 and M2 operate complementarily.

The source and back gate of each of PMOS transistors M3 and M4 are connected to a power supply potential VDD (for example, 10 V) which is boosted in order to drive the high-side NMOS transistor. The drain of the transistor M3 is connected to the gate of the transistor M4 and the drain of the transistor M4 is connected to the gate of the transistor M3 in a crossed manner. Also, the drain of the transistor M3 is connected to the gate of a PMOS transistor M5 for driving the high-side NMOS transistor, and to the drain of the NMOS transistor M1. Further, the drain of the transistor M4 is connected to the drain of the NMOS transistor M2.

When the power supply potential VDD supplied to the level shift circuit 50A shown in FIG. 4 is 10 V, a maximum value of each of a gate-source voltage VGS and a drain-source voltage VDS of the transistors M3 and M4 is about 10 V. Further, the maximum value of the drain-source voltage VDS of each of the transistors M1 and M2 is also about 10 V. Accordingly, the transistors M1 to M4 need to have a high breakdown voltage, that is, 10 V or higher. The use of the high breakdown voltage transistors causes an increase in chip area and an increase in the number of manufacturing steps, leading to an increase in manufacturing costs of the level shift circuit.

Meanwhile, a level shift circuit 50B shown in FIG. 5 which is a modified example of the level shift circuit 50A shown in FIG. 4 is disclosed in Japanese Unexamined Patent Application Publication No. 11-205123. The level shift circuit 50B includes four clamp transistors M51 to M54. The PMOS transistor M51 and the NMOS transistor M53 are connected in series between the drain of the transistor M3 and the drain of the transistor M1. Further, the PMOS transistor M52 and the NMOS transistor M54 are connected in series between the drain of the transistor M3 and the drain of the transistor M1. The gates of the transistors M51 to M54 are connected to the power supply potential VDD through a Zener diode 504, and are biased by a constant bias voltage V_BIAS (for example, VDD/2).

In the level shift circuit 50B shown in FIG. 5, the drain potential of each of the transistors M1 and M2 is clamped to the bias voltage V_BIAS (V_BIAS−threshold voltage Vth, to be exact) or lower through the operations of the four clamp transistors M51 to M54. Further, the drain potential of each of the transistors M3 and M4 is clamped to the V_BIAS (V_BIAS+threshold voltage Vth, to be exact) or higher. In other words, appropriate setting of the V_BIAS enables the level shift circuit 50B to suppress an excessive rise of the gate-source voltage VGS and drain-source voltage VDS of each of the transistors M1 to M4. Consequently, the level shift circuit 50B can be produced using a transistor having a low breakdown voltage relative to the maximum potential difference between the power supply potential VDD and the ground potential.

SUMMARY

In order to bias the clamp transistors M51 to M54, the level shift circuit 50B in the prior art shown in FIG. 5 requires the Zener diode 504 for supplying the constant bias voltage V_BIAS to the gates of the clamp transistors M51 to M54. In this regard, the present inventor has recognized that, when the level shift circuit 50B is produced using CMOS processes, it is difficult to mount the Zener diode together with other transistors on the same chip.

A first exemplary aspect of the present invention is a level shift circuit connectable to a power semiconductor device including a high-side NMOS transistor serving as a high-side switching element, a low-side switching element, and a bootstrap circuit that generate a first potential by shifting a source potential of the high-side NMOS transistor to high potential side. The level shift circuit includes a drive transistor, a first PMOS transistor, and first and second clamp transistors of PMOS type.

Herein, the drive transistor has a source-drain path coupled between the first potential and the source potential, to generate an output signal for driving the gate of the high-side NMOS transistor. The first PMOS transistor has a source and a back gate coupled to the first potential, and a drain coupled to the gate of the drive transistor. The first clamp transistor has a gate coupled to the source potential of the high-side NMOS transistor, and a source and a back gate coupled to the drain of the first PMOS transistor. Further, the second clamp transistor has a gate coupled to the source potential of the high-side NMOS transistor, and a source and a back gate coupled to the gate of the first PMOS transistor.

As described above, the level shift circuit according to the first exemplary aspect of the present invention uses the source potential of the high-side NMOS transistor as a bias voltage for the first and second clamp transistors. Meanwhile, a potential difference between the first potential generated by the bootstrap circuit and the source potential of the high-side NMOS transistor, which is a reference potential, is always constant, and the two potentials change relative to each other.

In other words, the bias voltage for the first and second clamp transistors dynamically changes in accordance with a change in the source potential of the high-side NMOS transistor. Accordingly, the first and second clamp transistors are capable of clamping the gate potential and drain potential of the first PMOS transistor, and the gate potential of the drive transistor to the source potential of the high-side NMOS transistor or higher. This suppresses an excessive rise of the gate-source voltage and drain-source voltage of the first PMOS transistor and the gate-source voltage of the drive transistor. Consequently, the level shift circuit according to the first exemplary aspect of the present invention can be produced using a transistor having a low breakdown voltage relative to the maximum potential difference between the first potential and the ground potential.

Further, the level shift circuit 50B shown in FIG. 5 requires a bias circuit such as a Zener diode for supplying a proper bias voltage to the first and second clamp transistors so as not to interrupt the level shift operation. Meanwhile, the level shift circuit according to the first exemplary aspect of the present invention requires no bias circuit such as a Zener diode, which facilitates the mounting of transistors on the same chip, unlike the level shift circuit 50B.

A second exemplary aspect of the present invention is a level shift circuit connectable to a power semiconductor device including a high-side NMOS transistor serving as a high-side switching element, a low-side switching element, and a bootstrap circuit that generate a first potential by shifting a source potential of the high-side NMOS transistor to high potential side, in a similar manner as in the level shift circuit according to the first exemplary aspect of the present invention. The level shift circuit includes a drive transistor, a first PMOS transistor, and a clamp circuit.

Herein, the drive transistor has a source-drain path coupled between the first potential and the source potential, to generate an output signal for driving the gate of the high-side NMOS transistor. The first PMOS transistor has a source and a back gate coupled to the first potential, and a drain coupled to the gate of the drive transistor. Further, the clamp circuit is supplied with the source potential of the high-side NMOS transistor as a bias voltage, and clamps a gate potential and a drain potential of the first PMOS transistor to the source potential of the high-side NMOS transistor or higher.

The level shift circuit configured as described above according to the second exemplary aspect of the present invention is capable of using transistors having a low breakdown voltage relative to the maximum potential difference between the first potential and the ground potential, as the first PMOS transistor and the drive transistor, in a similar manner as in the level shift circuit according to the first exemplary aspect of the present invention. Further, the level shift circuit according to the second exemplary aspect of the present invention can realize a circuit configuration suitable for CMOS processes, compared to the level shift circuit disclosed in Japanese Unexamined Patent Application Publication No. 11-205123.

According to the above exemplary aspects of the present invention, it is possible to provide a level shift circuit that can be produced using a low breakdown voltage transistor and has a circuit configuration suitable for CMOS processes.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments to which the present invention is applied will be described in detail below with reference to the drawings. The same components are denoted by the same reference symbols throughout the drawings, and the redundant explanation thereof is omitted as appropriate to clarify the explanation.

Figure 1:
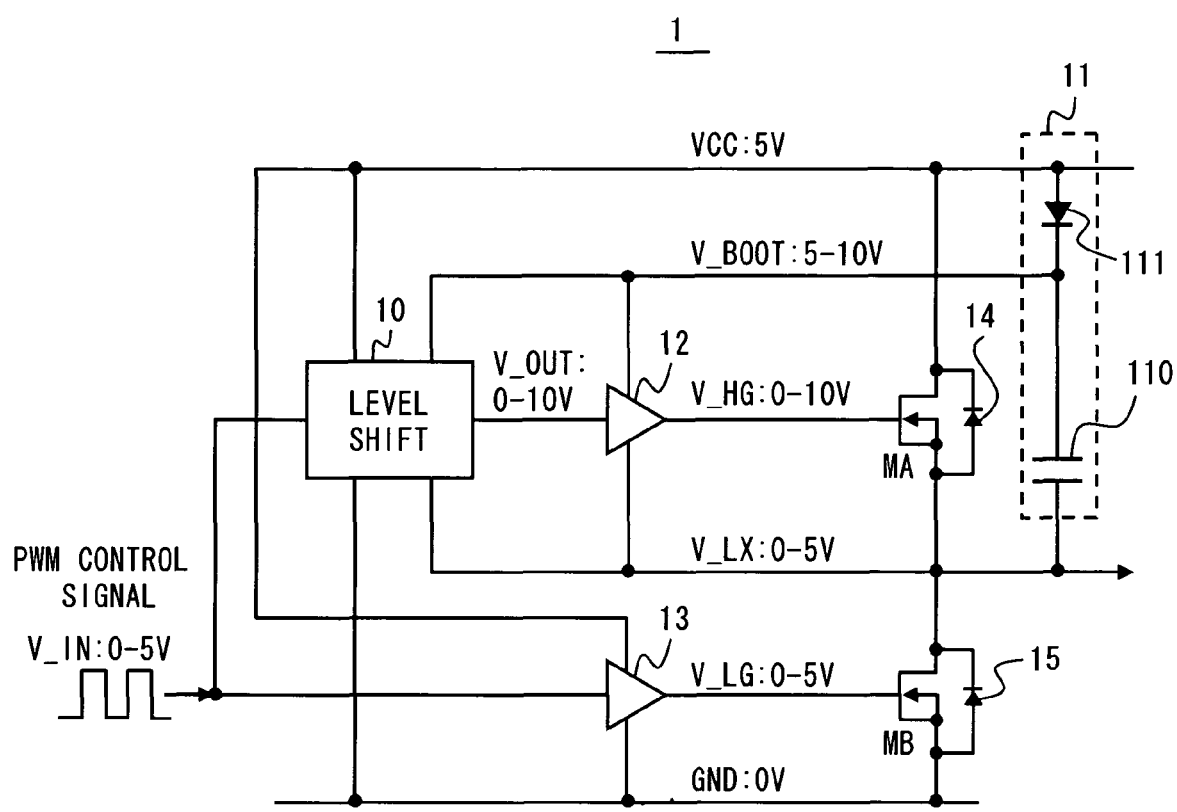
FIG. 1 is a circuit block diagram showing a power semiconductor device as an example of the application of a level shift circuit according to an exemplary embodiment of the present invention.
Figure 2:
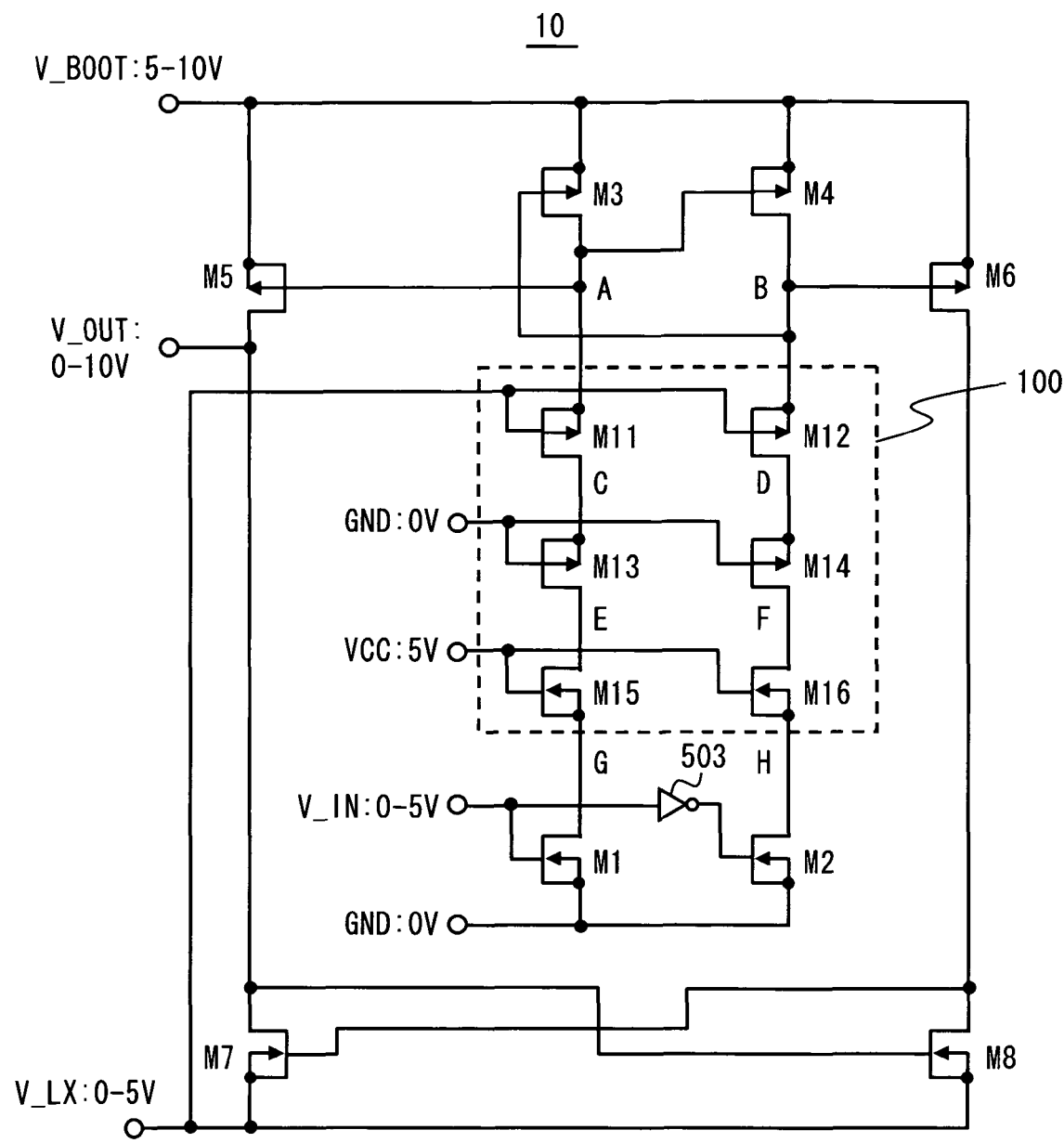
FIG. 2 is a circuit block diagram showing the level shift circuit according to an exemplary embodiment of the present invention.
Figure 3:
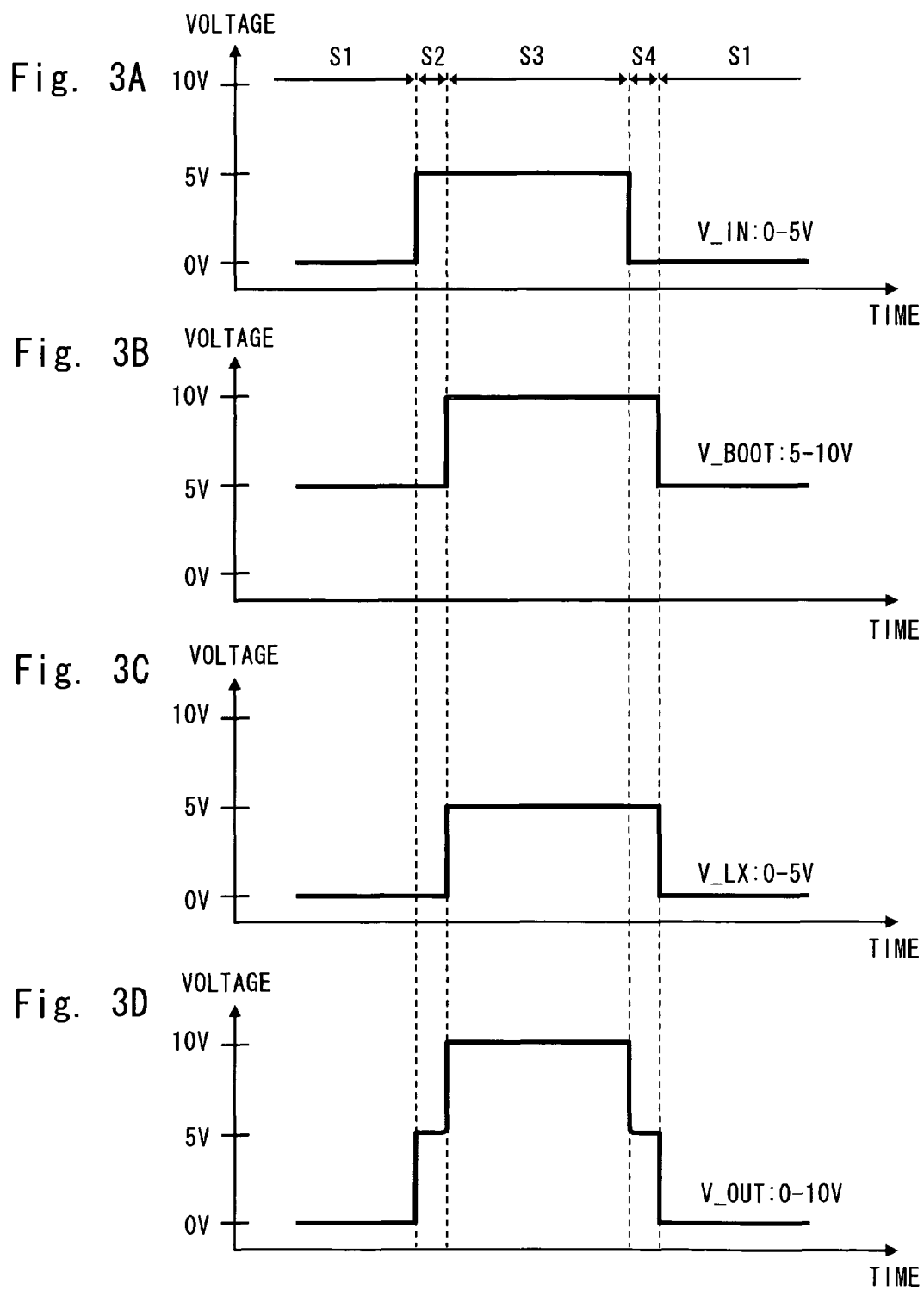
FIGS. 3A to 3D are waveform charts each showing input and output signals of the level shift circuit shown in FIG. 2.
Figure 4:
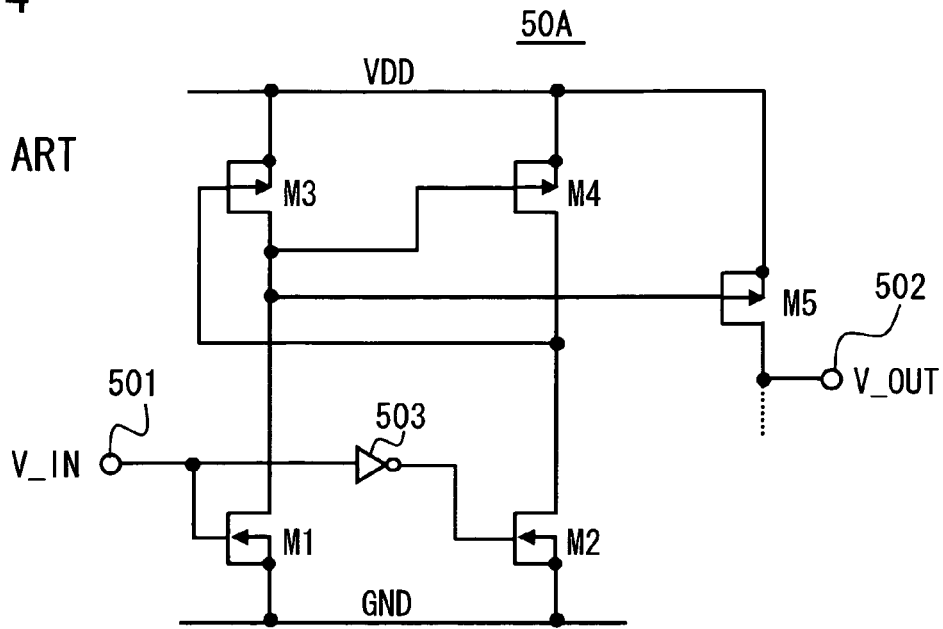
FIG. 4 is a circuit block diagram showing a level shift circuit according to the prior art.

FIG. 1 is a circuit block diagram showing a power semiconductor device 1 to which a level shift circuit 10 according to an exemplary embodiment of the present invention is applied. FIG. 2 is a circuit block diagram showing the configuration of the level shift circuit 10. The characteristics of input and output signals of the level shift circuit 10 and the specific configuration of the level shift circuit 10 are described below with reference to FIGS. 1 and 2.

The power semiconductor device 1 shown in FIG. 1 includes an NMOS transistor MA serving as a high-side switching element, and an NMOS transistor MB serving as a low-side switching element. The NMOS transistors MA and MB are connected in series between a power supply potential VCC and a ground potential GND. In this configuration, the drain of the high-side NMOS transistor MA is connected to the power supply potential VCC. The source and back gate of the transistor MA are connected to the drain of the low-side NMOS transistor MB. The source of the transistor MB is connected to the ground potential GND. Further, the gate of the transistor MA is driven by a high-side drive signal supplied from a drive buffer 12 described later. Likewise, the gate of the transistor MB is driven by a low-side drive signal supplied from a drive buffer 13 described later.

A bootstrap circuit 11 includes a capacitor 110 charged when the high-side NMOS transistor MA is off. The bootstrap circuit 11 charges the capacitor 110 through a diode 111 connected to the power supply potential VCC. The bootstrap circuit 11 causes the level shift circuit 10 and the drive buffer 12, which are provided so as to drive the transistor MA, to operate using the charging voltage of the capacitor 110. Specifically, the bootstrap circuit 11 boosts a source potential V_LX of the transistor MA by a predetermined voltage level, thereby generating a boot potential V_BOOT.

The level shift circuit 10 receives a PWM control signal and increases the amplitude of the PWM control signal to thereby generate an output signal. The output signal (V_OUT) of the level shift circuit 10 is supplied to the drive buffer 12 so as to drive the high-side NMOS transistor MA.

The drive buffer 12 generates a high-side drive signal based on the output signal of the level shift circuit 10. Further, the drive buffer 13 receives the PWM control signal and generates a low-side drive signal based on the PWM control signal.

Diodes 14 and 15 protect the transistors MA and MB against overvoltage.

Note that, in this exemplary embodiment, a description is given using the following specific values for the power supply potential (VCC), the ground potential (GND), the boot potential (V_BOOT), a PWM control signal potential (V_IN), an output signal potential of the level shift circuit 10 (V_OUT), the source potential of the high-side NMOS transistor MA (V_LX), a high-side drive signal potential V_HG, and a low-side drive signal potential V_LG, for ease of explanation.

VCC: 5 V
GND: 0 V
V_IN: 0-5 V
V_OUT: 0-10 V
V_BOOT: 5-10 V
V_LX: 0-5 V
V_HG: 0-10 V
V_LG: 0-5 V

Referring now to FIG. 2, a specific configuration example of the level shift circuit 10 will be described. Note that, for ease of explanation, transistors M1 to M5 and an inverter 503, which are part of components of the level shift circuit 10 shown in FIG. 2, are denoted by the same reference symbols as those of the corresponding components of the level shift circuit 50B shown in FIG. 5.

As shown in FIG. 2, the PMOS transistor M5 and an NMOS transistor M7 are connected in series between the V_BOOT and V_LX. Further, a PMOS transistor M6 and an NMOS transistor M8 are connected in parallel with the transistors M5 and M7 and in series between the V_BOOT and V_LX.

The gate of the transistor M6 is connected to the drain of the PMOS transistor M4. In other words, the gates of the PMOS transistors M5 and M6 are driven by the transistors M3 and M4 that operate complementarily according to the voltage V_IN of the PWM control signal. As a result, the transistors M5 and M6 also perform on/off operations complementarily according to the voltage V_IN of the PWM control signal. Note that, as described above, the transistor M5 is a drive transistor that generates an output signal for driving the high-side NMOS transistor MA.

The gate of the NMOS transistor M7 is connected to the drain of the PMOS transistor M6. The gate of the NMOS transistor M8 is connected to the drain of the PMOS transistor M5. In other words, the gates of the NMOS transistors M7 and M8 are driven by the transistors M5 and M6 that operate complementarily. Thus, the transistors M7 and M8 perform on/off operations complementarily.

Further, the level shift circuit 10 shown in FIG. 2 includes a clamp circuit 100 including transistors M11 to M16. Each of the transistors M11 to M16 clamps the source potential thereof to a predetermined potential or higher, or a predetermined potential or lower. Three clamp transistors M11, M13, and M15 are connected in series between the PMOS transistor M3 and the NMOS transistor M1. Three clamp transistors M12, M14, and M16 are connected in series between the PMOS transistor M3 and the NMOS transistor M1.

Both the clamp transistors M11 and M12 are PMOS transistors. The gates of the transistors M11 and M12 are biased by the source potential V_LX of the high-side NMOS transistor MA. The source and back gate of the transistor M11 are connected to the drain of the transistor M3. The source and back gate of the transistor M12 are connected to the drain of the transistor M4. In other words, the transistors M11 and M12 respectively clamp the drain potentials of the transistors M3 and M4 to the V_LX or higher: V_LX+threshold voltage Vth or higher, to be exact. In this case, the threshold voltage Vth is a gate-source voltage necessary for causing the transistor M11 or M12 to turn on.

Both the clamp transistors M13 and M14 are PMOS transistors. The gates of the transistors M13 and M14 are biased by the ground potential GND (0 V). The source and back gate of the transistor M13 are connected to the drain of the transistor M11. The source and back gate of the transistor M14 are connected to the drain of the transistor M12. In other words, the transistors M13 and M14 respectively clamp the drain potentials of the transistors M11 and M12 to 0 V or higher: threshold voltage Vth or higher, to be exact. In this case, the threshold voltage Vth is a gate-source voltage necessary for causing the transistor M13 or M14 to turn on.

Unlike the transistors N11 to N14 described above, both the clamp transistors M15 and M16 are NMOS transistors. The gates of the transistors M15 and M16 are biased by the power supply potential VCC (5 V). The source and back gate of the transistor M15 are connected to the drain of the NMOS transistor M1. The source and back gate of the transistor M16 are connected to the drain of the NMOS transistor M2. In other words, the transistors M15 and M16 respectively clamp the drain potentials of the transistors M1 and M2 to the power supply potential VCC (5 V) or lower: power supply potential VCC−threshold voltage Vth or lower, to be exact. In this case, the threshold voltage Vth is a gate-source voltage necessary for causing the transistor M15 or M16 to turn on.

Next, operations of the level shift circuit 10 according to this exemplary embodiment will be described below. Operating states of the level shift circuit 10 can be classified into four states S1 to S4 as described below, in accordance with a change in level of the PWM control signal potential V_IN and a change in on/off-state of the high-side NMOS transistor MA. FIGS. 3A to 3D show periods of time corresponding to States S1 to S4. FIGS. 3A to 3D are waveform charts each showing input and output signals of the level shift circuit 10.

<State S1>

The V_IN is 0 V; the transistor MA is off; the V_LX is 0 V; and the V_BOOT is 5 V.

<State S2>

The V_IN is 5 V; the transistor MA switches from the off-state to the on-state; the V_LX is 0 V; and the V_BOOT is maintained at 5 V.

<State S3>

The V_IN is 5 V; the transistor MA is on; the V_LX is 5 V; and the V_BOOT is 10 V.

<State S4>

The V_IN is 0 V; the transistor MA switches from the on-state to the off-state; the V_LX is maintained at 5 V; and the V_BOOT is maintained at 10 V.

In State S1, the transistor M1 is turned off; M2 is turned on; M3 is turned on; M4 is turned off; M5 is turned off; M6 is turned on; M7 is turned on; and M8 is turned off. Accordingly, the output signal potential V_OUT of the level shift circuit 10 is 0 V in accordance with the V_LX. Note that, since the voltage V_LX applied to the gates of the clamp transistors M11 and M12 is 0 V, all the clamp transistors M11 to M16 are turned on. This prevents an abnormality from occurring in the basic level shift operation of the level shift circuit 10. In this case, since the V_BOOT is 5 V, there exists no transistor that may cause a problem of the breakdown voltage in the level shift circuit 10.

In State S2, the transistor M1 is turned on; M2 is turned off; M3 is turned off; M4 is turned on; M5 is turned on; M6 is turned off; M7 is turned off; and M8 is turned on. As a result, the output signal potential V_OUT of the level shift circuit 10 changes to 5 V in accordance with the V_BOOT. Note that, since the voltage V_LX applied to the gates of the clamp transistors M11 and M12 is 0 V, like in State S1, all the clamp transistors M11 to M16 are turned on. This prevents an abnormality from occurring in the basic level shift operation of the level shift circuit 10. Further, since the V_BOOT is 5 V, there exists no transistor that may cause the problem of the breakdown voltage in the level shift circuit 10 also in State S2.

In State S3, when the high-side NMOS transistor MA is turned on according to the PWM control signal potential V_IN, the V_LX is raised to 5 V and the V_BOOT is raised to 10 V by the capacitor 110.

In the following description, in-depth consideration is given to a gate-source voltage VGS and a drain-source voltage VDS of each transistor provided in the level shift circuit 10 in State S3. In State S3, the voltage applied to the gates of the clamp transistors M11 and M12 is 5 V. This is because the source potential V_LX rises up to 5 V when the high-side NMOS transistor MA is turned on. Accordingly, the potential at a node A shown in FIG. 2, that is, the drain potential of the transistor M3, the gate potential of the transistor M4, and the gate potential of the transistor M5 are clamped to 5 V (5+Vth [V], to be exact) or higher. Further, the potential at a node B shown in FIG. 2, that is, the drain potential of the transistor M4, the gate potential of the transistor M3, and the gate potential of the transistor M6 are clamped to 5 V (5+Vth [V], to be exact) or higher. This prevents the VGS and VDS of the transistor M3, the VGS and VDS of the transistor M4, the VGS of the transistor M5, and the VGS of the transistor M6 from becoming equal to or higher than 5 V. Further, a potential difference between the V_BOOT and V_LX is maintained at 5 V, which prevents a problem of the breakdown voltage from occurring in the VDS of each of the transistors M5 and M6 and the VGS and VDS of each of the transistors M7 and M8. Accordingly, the breakdown voltage of each of the transistors M3 to M8 in State S3 causes no problem.

Next, consideration is given to the VGS and VDS of each of the transistors M1 and M2 in State S3. The voltage applied to the gates of the clamp transistors M15 and M16 is equal to the power supply potential VCC (5 V). Accordingly, the potentials at a node G and a node H as shown in FIG. 2, that is, the drain potentials of the transistors M1 and M2 are clamped to 5 V (5−Vth [V], to be exact) or lower. Thus, the breakdown voltage of the VGS and VDS of each of the transistors M1 and M2 causes no problem.

Note that the voltage V_LX applied to the gates of the clamp transistors M11 and M12 in State S3 is 5 V. Further, the V_BOOT is 10 V. As a result, all the clamp transistors M11 to M16 are turned on. This prevents an abnormality from occurring in the basic level shift operation of the level shift circuit 10.

Lastly, in State S4, the high-side NMOS transistor MA switched to the off-state. However, since State S4 is a transient state where the transistor MA is turning off, the V_LX is maintained at 5 V and the V_BOOT is maintained at 10 V. In State S4, the transistor M1 is turned off; M2 is turned on; M3 is turned on; M4 is turned off; M5 is turned off; M6 is turned on; M7 is turned on; and M8 is turned off. As a result, the output signal potential V_OUT of the level shift circuit 10 changes to 5 V in accordance with the V_LX.

In State S4, the voltage applied to the gates of the clamp transistors M11 and M12 is 5 V, like in State S3. Accordingly, the potentials at the node A and the node B shown in FIG. 2 are clamped to 5 V (5+Vth [V], to be exact) or higher. Therefore, as in the case of State S3, the breakdown voltage of each of the transistors M3 to M8 causes no problem.

Further, the voltage applied to the gates of the clamp transistors M15 and M16 is equal to the power supply potential VCC (5 V). Accordingly, as described in the case of State S3, the potentials at the node G and the node H shown in FIG. 2, that is, the drain potentials of the transistors M1 and M2 are clamped to 5 V (5−Vth [V], to be exact) or lower. Therefore, the breakdown voltage of the VGS and VDS of each of the transistors M1 and M2 causes no problem.

Note that the voltage V_LX applied to the gates of the clamp transistors M11 and M12 in State S4 is 5 V, and the V_BOOT is 10 V. Accordingly, all the clamp transistors M11 to M16 are turned on. This prevents an abnormality from occurring in the basic level shift operation of the level shift circuit 10.

As described above, the clamp transistor M11 clamps the drain potential of the transistor M3, the gate potential of the transistor M4, and the gate potential of the transistor M5 to the source potential V_LX+threshold voltage Vth of the high-side NMOS transistor MA or higher. Further, the clamp transistor M12 clamps the drain potential of the transistor M4, the gate potential of the transistor M3, and the gate potential of the transistor M6 to the source potential V_LX+threshold voltage Vth of the high-side NMOS transistor MA or higher.

In this case, the source potential V_LX of the transistor MA is the reference potential of the V_BOOT generated by the bootstrap circuit 11, and the potential difference between the V_BOOT and V_LX is always constant (5 V in a specific example of this embodiment). Accordingly, the clamp transistors M11 and M12 are capable of limiting the maximum value of each of the VGS and VDS of the transistor M3, the VGS and VDS of the transistor M4, the VGS of the transistor 5, and the VGS of the transistor M6 to "V_BOOT−V_LX−Vth (5−Vth [V] in a specific example of this embodiment)" which is substantially a constant value, irrespective of the fluctuation in the level of the V_BOOT.

In view of the foregoing, it is not necessary for the level shift circuit 10 according to this exemplary embodiment to use a transistor having a high breakdown voltage corresponding to the V_BOOT which is set to be higher than the power supply potential VDD. In the above-mentioned specific example, the transistors M1 to M8 and transistors M11 to M16 are not necessarily limited to high breakdown voltage transistors having a high breakdown voltage of 10 V or higher. Alternatively, transistors having a breakdown voltage of about 7 V, for example, may be used.

Figure 5:
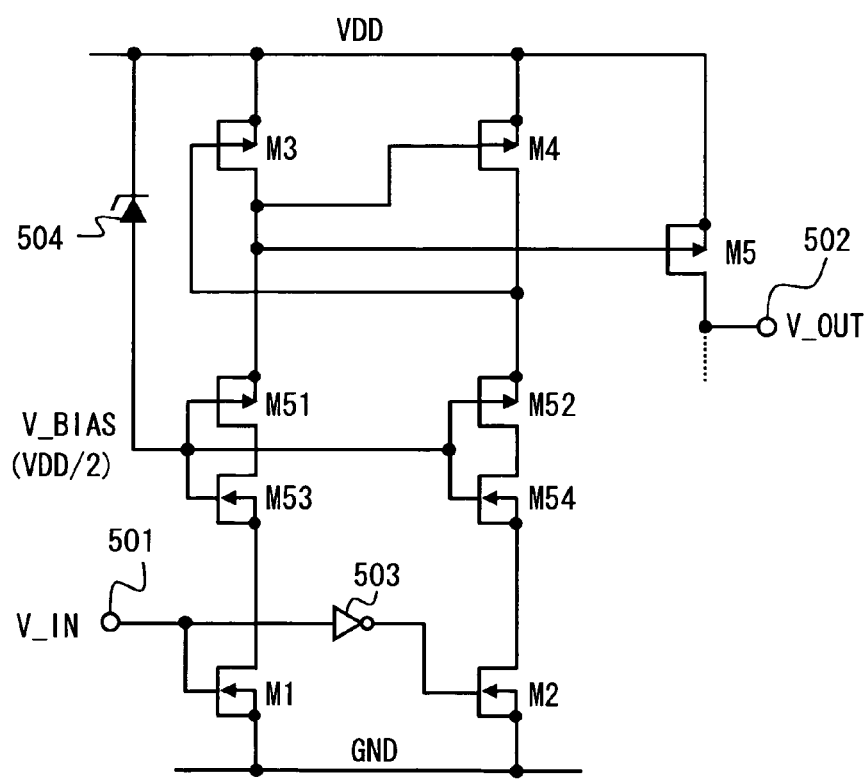
FIG. 5 is a circuit block diagram showing a level shift circuit according to the prior art.

Furthermore, the level shift circuit 10 according to this exemplary embodiment does not require the Zener diode 504 serving as a bias circuit that the level shift circuit 50B shown in FIG. 5 requires. Accordingly, the level shift circuit 10 can realize a circuit configuration suitable for CMOS processes, compared to the level shift circuit 50B.

Additionally, although not explicitly stated in Japanese Unexamined Patent Application Publication No. 11-205123, the voltage level of the power supply voltage VDD (which corresponds to V_BOOT in this exemplary embodiment), which is supplied from the bootstrap circuit to the level shift circuit 50B, may fluctuate. If the power supply voltage VDD fluctuates, the provision of the Zener diode is not sufficient to generate the VDD/2 corresponding to the fluctuating VDD. As a result, the drain potentials of the transistors M1 and M2 are clamped insufficiently, and the drain-source voltage of each of the transistors M1 and M2 may undesirably exceed the breakdown voltage thereof. In other words, in order to fully cope with the fluctuation of the power supply voltage VDD (which corresponds to V_BOOT in this exemplary embodiment), the level shift circuit 50B also requires a bias adjustment circuit capable of generating the VDD/2 corresponding to the fluctuating VDD.

On the other hand, in the specific configuration of the level shift circuit 10 shown in FIG. 2, the clamp transistors M15 and M16 are biased by the power supply potential VCC. Meanwhile, the V_BOOT is generated based on the VCC (see FIG. 1). In other words, the VCC and V_BOOT fluctuate relative to each other, that is, as the power supply potential VCC increases or decreases, the V_BOOT also increases or decreases. Therefore, the level shift circuit 10 shown in FIG. 2 is capable of coping with the fluctuation of the power supply potential VCC without additionally providing a bias adjustment circuit.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A level shift circuit connectable to a power semiconductor device including a high-side NMOS transistor serving as a high-side switching element, a low-side switching element, and a bootstrap circuit that generate a first potential by shifting a source potential of the high-side NMOS transistor to high potential side, the level shift circuit comprising:
   a drive transistor having a source-drain path coupled between the first potential and the source potential, to generate an output signal for driving a gate of the high-side NMOS transistor;
   a first PMOS transistor having a source and a back gate coupled to the first potential, and a drain coupled to a gate of the drive transistor;
   a first clamp transistor of PMOS type having a gate coupled to the source potential of the high-side NMOS transistor, and a source and a back gate coupled to the drain of the first PMOS transistor; and
   a second clamp transistor of PMOS type having a gate coupled to the source potential of the high-side NMOS transistor, and a source and a back gate coupled to a gate of the first PMOS transistor.

2. The level shift circuit according to claim 1, further comprising:
   a first NMOS transistor having a source and a back gate coupled to a ground potential, and a gate supplied with a pulse width modulation (PWM) control signal;
   a second NMOS transistor having a source and a back gate coupled to the ground potential, and a gate supplied with an inverted signal of the PWM control signal; and
   a second PMOS transistor having a source and a back gate coupled to the first potential, and a drain coupled to each of the gate of the first PMOS transistor and the source of the second clamp transistor,
   wherein the first clamp transistor has a source-drain path coupled between the drain of the first PMOS transistor and a drain of the first NMOS transistor, and
   the second clamp transistor has a source-drain path coupled between the drain of the second PMOS transistor and a drain of the second NMOS transistor.

3. The level shift circuit according to claim 2, further comprising:
   a third clamp transistor of PMOS type and a fourth clamp transistor of NMOS type connected in series between a drain of the first clamp transistor and the drain of the first NMOS transistor; and
   a fifth clamp transistor of PMOS type and a sixth clamp transistor of NMOS type connected in series between a drain of the second clamp transistor and the drain of the second NMOS transistor,
   wherein the third and fifth clamp transistors each have a gate coupled to the ground potential, and
   the fourth and sixth clamp transistors each have a gate coupled to the power supply potential.

4. The level shift circuit according to claim 3, wherein
   a source and a back gate of the third clamp transistor are coupled to the drain of the first clamp transistor,
   a drain of the third clamp transistor is coupled to a drain of the fourth clamp transistor,
   a source and a back gate of the fourth clamp transistor are coupled to the drain of the first NMOS transistor,
   a source and a back gate of the fifth clamp transistor are coupled to the drain of the second clamp transistor;
   a drain of the fifth clamp transistor is coupled to a drain of the sixth clamp transistor, and
   a source and a back gate of the sixth clamp transistor are coupled to the drain of the second NMOS transistor.

5. The level shift circuit according to claim 2, further comprising:
   a third PMOS transistor having a source coupled to the first potential, and a gate coupled to the drain of the second PMOS transistor;
   a third NMOS transistor having a source coupled to a source of the high-side NMOS transistor, a drain coupled to a drain of the drive transistor, and a gate coupled to a drain of the third PMOS transistor; and
   a fourth NMOS transistor having a source coupled to the source of the high-side NMOS transistor, a drain coupled to the drain of the third PMOS transistor, and a gate coupled to the drain of the drive transistor.

6. A level shift circuit connectable to a power semiconductor device including a high-side NMOS transistor serving as a high-side switching element, a low-side switching element, and a bootstrap circuit that generate a first potential by shifting a source potential of the high-side NMOS transistor to high potential side, the level shift circuit comprising:
   a drive transistor having a source-drain path coupled between the first potential and the source potential, to generate an output signal for driving a gate of the high-side NMOS transistor;
   a first PMOS transistor having a source and a back gate coupled to the first potential, and a drain coupled to a gate of the drive transistor; and
   a clamp circuit supplied with the source potential of the high-side NMOS transistor as a bias voltage, to clamp a gate potential and a drain potential of the first PMOS transistor to the source potential of the high-side NMOS transistor or higher.

7. A power semiconductor device comprising:
   a high-side NMOS transistor serving as a high-side switching element;
   a low-side switching element coupled to the high-side NMOS transistor;
   a bootstrap circuit that shifts a level of a source potential of the high-side NMOS transistor to a high potential side to generate a first potential;
   a drive transistor having a source-drain path coupled between the first potential and the source potential, to generate an output signal for driving a gate of the high-side NMOS transistor;
   a first PMOS transistor having a source and a back gate coupled to the first potential, and a drain coupled to a gate of the drive transistor;
   a first clamp transistor of PMOS type having a gate coupled to the source potential of the high-side NMOS transistor, and a source and a back gate coupled to the drain of the first PMOS transistor; and
   a second clamp transistor of PMOS type having a gate coupled to the source potential of the high-side NMOS transistor, and a source and a back gate coupled to a gate of the first PMOS transistor.

8. The power semiconductor device according to claim 7, further comprising:
   a first NMOS transistor having a source and a back gate coupled to a ground potential, and a gate supplied with a pulse width modulation (PWM) control signal;
   a second NMOS transistor having a source and a back gate coupled to the ground potential, and a gate supplied with an inverted signal of the PWM control signal; and
   a second PMOS transistor having a source and a back gate coupled to the first potential, and a drain coupled to each of the gate of the first PMOS transistor and the source of the second clamp transistor,
   wherein the first clamp transistor has a source-drain path coupled between the drain of the first PMOS transistor and a drain of the first NMOS transistor, and
   the second clamp transistor has a source-drain path coupled between the drain of the second PMOS transistor and a drain of the second NMOS transistor.

9. The power semiconductor device according to claim 8, further comprising:
   a third clamp transistor of PMOS type and a fourth clamp transistor of NMOS type connected in series between a drain of the first clamp transistor and the drain of the first NMOS transistor; and
   a fifth clamp transistor of PMOS type and a sixth clamp transistor of NMOS type connected in series between a drain of the second clamp transistor and the drain of the second NMOS transistor,
   wherein the third and fifth clamp transistors each have a gate coupled to the ground potential, and
   the fourth and sixth clamp transistors each have a gate coupled to the power supply potential.

10. The power semiconductor device according to claim 9, wherein
   a source and a back gate of the third clamp transistor are coupled to the drain of the first clamp transistor,
   a drain of the third clamp transistor is coupled to a drain of the fourth clamp transistor,
   a source and a back gate of the fourth clamp transistor are coupled to the drain of the first NMOS transistor,
   a source and a back gate of the fifth clamp transistor are coupled to the drain of the second clamp transistor;
   a drain of the fifth clamp transistor is coupled to a drain of the sixth clamp transistor, and
   a source and a back gate of the sixth clamp transistor are coupled to the drain of the second NMOS transistor.

11. The power semiconductor device according to claim 8, further comprising:
   a third PMOS transistor having a source coupled to the first potential, and a gate coupled to the drain of the second PMOS transistor;
   a third NMOS transistor having a source coupled to a source of the high-side NMOS transistor, a drain coupled to a drain of the drive transistor, and a gate coupled to a drain of the third PMOS transistor; and
   a fourth NMOS transistor having a source coupled to the source of the high-side NMOS transistor, a drain coupled to the drain of the third PMOS transistor, and a gate coupled to the drain of the drive transistor.

12. A level shift circuit supplied with a first control signal and a second control signal having a voltage value shifted from a voltage value of the first control signal to a high potential side by a predetermined potential, and receiving a first drive control signal, the level shift circuit comprising:
   a drive transistor that outputs a second drive control signal obtained by shifting a voltage level of the first drive control signal;
   a first transistor supplied with the second control signal for level shifting and controlled based on the first drive control signal;
   a second transistor receiving the first drive control signal; and
   a clamp transistor inserted between the first transistor and the second transistor and having a gate applied with the first control signal, to clamp a drain potential of the first transistor.

* * * * *